United States Patent [19]
Tsukagoshi

[11] Patent Number: 5,689,453
[45] Date of Patent: Nov. 18, 1997

[54] DATA STORING APPARATUS HAVING A MEMORY CAPABLE OF STORING ANALOG DATA

[75] Inventor: Masaaki Tsukagoshi, Gunma, Japan

[73] Assignee: Sanyo Electric Co., Ltd., Osaka, Japan

[21] Appl. No.: 493,621

[22] Filed: Jun. 22, 1995

[30] Foreign Application Priority Data

Jun. 24, 1994 [JP] Japan .................................. 6-143388

[51] Int. Cl.$^6$ .................................................. G11C 27/00
[52] U.S. Cl. .................................................. 365/45; 365/195
[58] Field of Search ........................................ 365/45, 195

[56] References Cited

U.S. PATENT DOCUMENTS

| 4,209,852 | 6/1980 | Hyatt ........................................ 365/45 |
| 5,339,275 | 8/1994 | Hyatt ........................................ 365/45 |
| 5,537,360 | 7/1996 | Jones et al ................................. 365/195 |

Primary Examiner—Son T. Dinh
Attorney, Agent, or Firm—Loeb & Loeb LLP

[57] ABSTRACT

A D/A converter converts input "n" bit digital data into discrete analog data by assigning each of the voltage values $V_0$–$V_{2^n-1}$ to each "n" bit digital data. A non-volatile memory capable of write and readout of analog data is used as a memory. The memory stores each analog data, which is represented by one of the voltage values $V_0$–$V_{2^n-1}$ corresponding to each "n" bit digital data, into a memory cell. The analog data readout from the memory is supplied to an A/D converter to be converted into the original "n" bit digital data. Thus, digital data represented by a plural number of bits is stored in a single memory cell, and memory capacity can be increased with a simple structure. The memory is divided into two areas, that is, a read/write area which allows both reading and writing and a write restricted area to which writing is restricted. A write restriction circuit prohibits writing of analog data to the write restricted area. In this structure, a single memory functions as both a ROM and RAM.

7 Claims, 2 Drawing Sheets

DATA STORING APPARATUS HAVING A MEMORY CAPABLE OF STORING ANALOG DATA

BACKGROUND OF THE INVENTION

1. Field of the Invention

This invention relates to a data storing apparatus, and more particularly to a data storing apparatus having a reduced size of memory while maintaining the memory capacity, which is achieved by converting plural bits of digital data into discrete analog data and storing the converted analog data in the memory.

2. Description of the Prior Art

A ROM (read only memory) has conventionally been used as a non-volatile memory for storing fixed data such as a predetermined program. On the other hand, a DRAM (dynamic random access memory) or SRAM (static random access memory) has been used as a volatile memory which allows the data to be successively updated. Such ROMs and RAMs generally store information in digital form.

Giving an example of a telephone set with an answering function, predetermined fixed data, such as an operation guide for the telephone set or fixed messages, are stored in digital form in the ROM, while the user's answering messages and incoming messages are recorded in analog form on an magnetic tape capable of long term recording.

Recently, the magnetic tape has been displaced by an SRAM for recording of voice sound, which is capable of reading and writing (i.e. updating) whenever necessary. Using the RAM for recording an answering message or incoming message has such advantages that data readout time is shorter, durability of the recording unit is superior, and telephone set size can be reduced. However, since these memories are adapted to store the data in digital form, analog data of voice sound must be first converted into digital form, and then stored as digital data in the memory cells.

When storing one type of digital data represented by "n" bits, "n" memory cells are required. For instance, storing a 10,000 bit digital data represented by "0" or "1" requires 10,000 memory cells. For this reason, in the case that the data amount is large (e.g. for A/D converted voice sound data), a memory needs to have a large capacity, which means that the ratio of the memory cost to the whole telephone set becomes large.

Another problem in storing an answering message or incoming message in the RAM is that the stored data is easily lost as a result of an interruption of the power supply (such as a power cut) because the RAM always requires the supply of electric power. In order to avoid such a situation, an extra back-up power source or back-up memory is generally provided.

SUMMARY OF THE INVENTION

This invention was conceived in order to overcome the above mentioned problems, and aims at providing a data storing apparatus which is capable of storing an increased amount of data while maintaining the memory size (in other words, which has a reduced memory size while maintaining the data amount stored therein). This can be achieved by converting plural bits of digital data into discrete analog data and storing the converted analog data in the memory.

For this purpose, the data storing apparatus in accordance with the invention has a memory which is capable of writing and reading out analog data. This data storing apparatus comprises a D/A converter for converting a predetermined number of bits of digital data into discrete analog data, a memory for storing the analog data, and an A/D converter for converting the analog data read out from the memory into the digital data represented by the predetermined number of bits. The memory is divided into a read/write area, which allows both writing (updating) and reading of data, and a write restricted area (i.e. read only area), to which updating of data is restricted by a write restriction circuit. In other words, a single memory has both a ROM function and a RAM function, realizing a memory circuit on a single chip. This can greatly reduce the memory cost.

If storing "n" bits of digital data in the memory in the conventional manner, the same number of memory cells (i.e. "n" memory cells) are required. On the contrary, in the present invention, voltage values $V_0$-$V_{2^n-1}$ are assigned to $2^n$ types of "n" bit digital data to generate discrete analog data, and as a result, digital data represented by a plurality of bits can be stored in a single memory cell after being converted into an analog form. In this simple structure, the memory capacity is effectively increased while maintaining the memory size.

A non-volatile memory is used as a memory in this invention, which is capable of storing analog data by controlling the amount of electrical charge applied to its floating gate. The non-volatile memory has a read/write area and a write restricted (i.e. read only) area. Thus, a single memory having two functions is realized and loss of data as a result of a power cut is avoided. Furthermore, the reliability of the data storing apparatus is improved, and the necessity of an extra backup memory or backup power source for avoiding data loss is removed.

The write restriction circuit can control the size or location of the write restricted area in the memory, and can easily change the size or location of this area in accordance with a type of the data storing apparatus, which realizes a higher degree of freedom for design change.

In another aspect of the invention, a data storing apparatus having a memory capable of writing and reading analog data comprises a first A/D converter for converting input analog data into digital data, a data compressor for compressing the A/D converted data to generate compressed digital data represented by a predetermined number of bits, a first D/A converter for converting the compressed digital data represented by the predetermined number of bits into discrete analog data, a memory for storing the discrete analog data, a second A/D converter for converting the analog data read out from the memory back to the predetermined bits of compressed digital data, a data decompressor for decompressing the compressed digital data, and a second D/A converter for converting the decompressed digital data into analog data. Data compression allows the memory capacity to be larger.

DESCRIPTION OF THE PREFERRED EMBODIMENT

Figure 1:
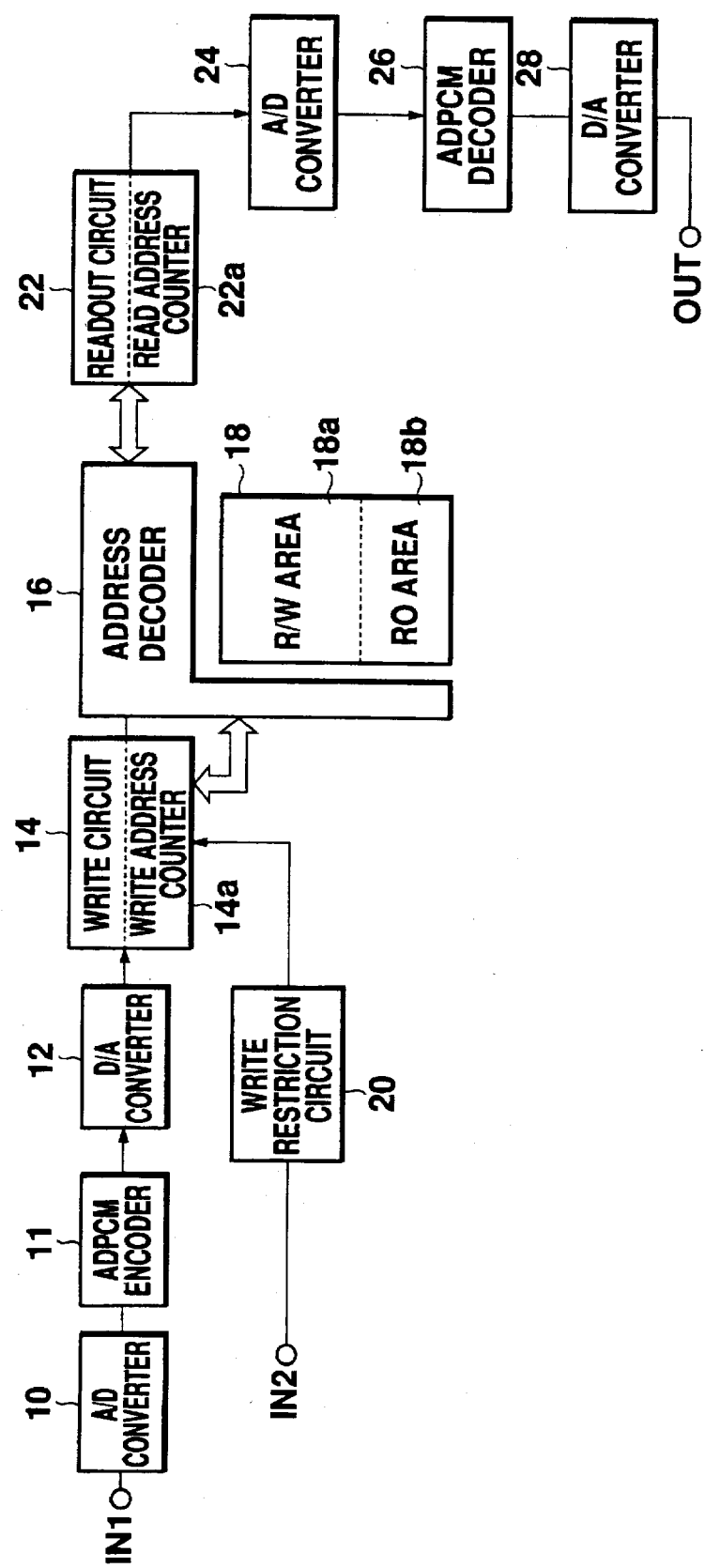
FIG. 1 is a schematic block diagram showing the data storing apparatus in accordance with the invention.

FIG. 1 schematically shows a structure of the data storing apparatus in accordance with the invention.

Analog data such as voice sound is input as voltage data via the input terminal IN1 to the A/D converter 10 which converts the input analog data into digital (PCM) data represented by a plurality of bits for the purpose of easy signal processing inside the apparatus.

The output of the A/D converter is connected to the input of the ADPCM (adaptive differential pulse code modulation) encoder 11 which compresses and encodes the plural bits of digital data. The ADPCM encoder 11 quantizes a differential of the digital data output from the A/D converter 10. During the quantization process, the ADPCM encoder 11 adaptively switches a bit assignment in accordance with the differential of the digital data to carry out data compression for encoding data.

The ADPCM encoder 11 is not necessarily required as long as the A/D converting means is provided for converting analog data to digital data. However, providing the ADPCM encoder 11 or an equivalent data compressor enables more efficient data processing. In other words, by using the ADPCM encoder 11, data is effectively compressed with respect to the input analog data (such as voice sound), thereby efficiently utilizing the memory 18 having a limited memory capacity.

Figure 2:
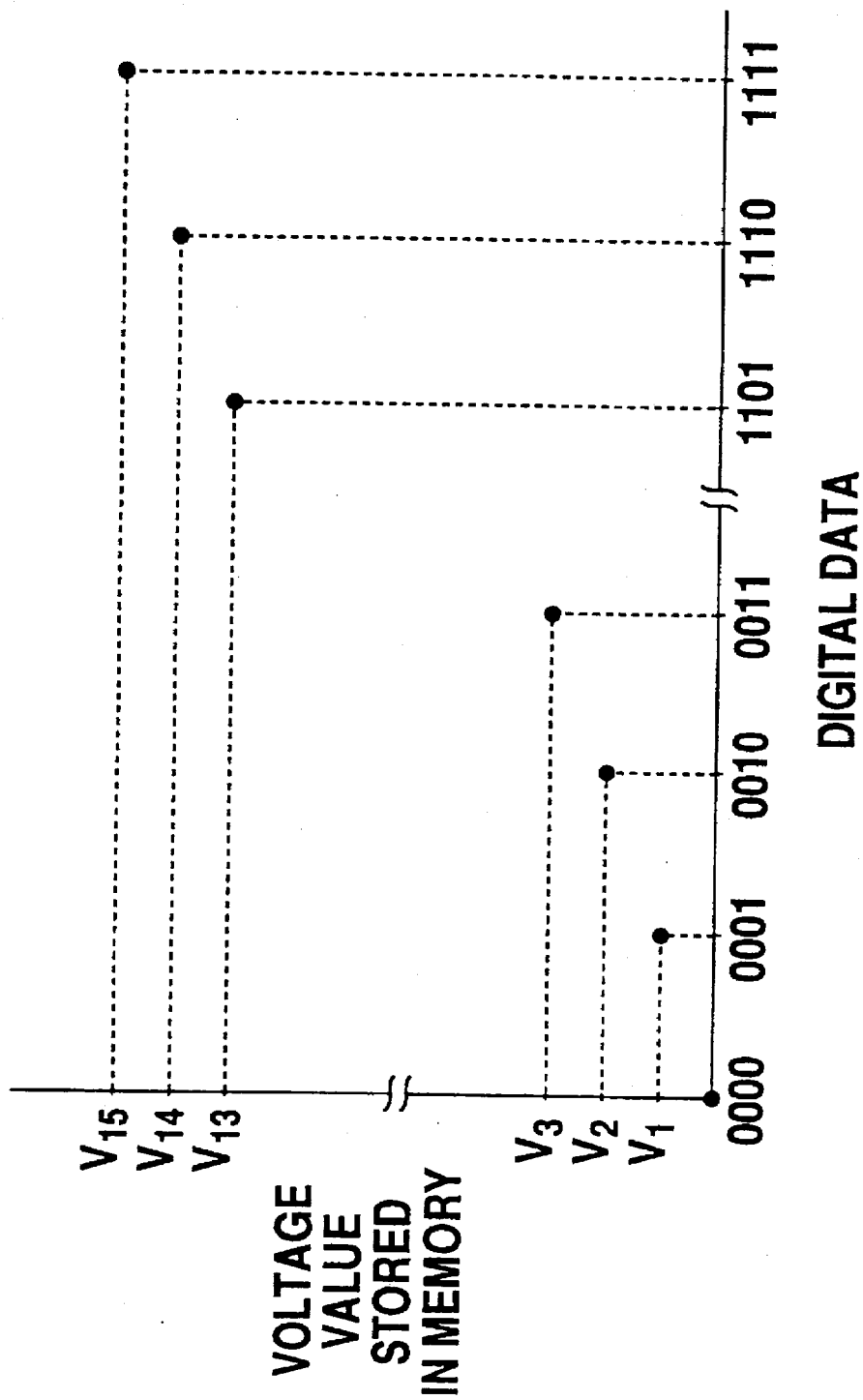
FIG. 2 is a chart showing a technique for converting digital data to discrete analog data.

The compressed (encoded) digital data is applied to the D/A converter 12 which converts the digital data represented by a plural number of bits into discrete analog data. The discrete analog data is to be stored in the memory 18. More particularly, in the D/A converter 12, the entire voltage storable in the memory is divided by a number corresponding to the number of bits. For example, referring to FIG. 2, assuming the case of 4 bit digital data, the voltage VM is divided by 16 ($=2^4$) and each of the voltage values $V_0$–$V_{15}$ is assigned to each of the 4 bit digital data. Thus, when the digital data is represented by "n" bits, the entire voltage VM is divided by $2^n$ and each of the voltage values $V_0$–$V_{2^n-1}$ is assigned to each of n bit digital data to generate discrete analog data.

The discrete analog data obtained by the D/A converter 12 is applied to the write circuit 14 which includes a write address counter 14a for determining a write address where the data is to be written. The detected write address value is supplied via the address bus to the address decoder 16. At the same time, the discrete analog data is supplied from the write circuit 14 through the data bus to the memory 18. In this manner, the discrete analog data is correctly written into a given memory cell, the address of which has been designated by the address decoder 16.

In this embodiment, a non-volatile EEPROM (electrically erasable programmable ROM) is used as a memory 18. It is known that the EEPROM can store analog data by controlling the amount of electrical charge applied to its floating gate. The amount of electrical charge applied to each floating gate corresponds to each of the discrete voltage values $V_0$–$V_{2^n-1}$. These electrical charges are applied to the floating gates of the EEPROM via the data bus. In this manner, the discrete analog data is stored in the EEPROM.

This technique allows digital data represented by a plurality of bits to be stored in a single memory cell. The total data amount stored in the memory can be increased considerably, and the memory capacity is greatly improved while maintaining the memory size small. Although the memory 18 is not limited to the EEPROM as long as it is capable of storing analog data, a non-volatile memory is preferable for avoiding data loss as a result of a power cut.

In the embodiment, the memory 18 is divided into two areas, i.e. a read/write (R/W) area 18a having the same function as a RAM, and a write restricted (read only) area 18b having the same function as a ROM.

The area partition of the memory 18 is controlled by a write restriction circuit 20. The write restriction circuit 20 is connected to the input IN2, through which write restriction data is input for determining the divided areas in the memory 18. The write restriction circuit 20 monitors each write address value determined by the write address counter 14a, and if the determined write address value is a value specified by the write restriction data as a write (update) prohibited address, the data is prohibited from being written in the write restricted (read only) area 18b.

The size and location of the write restricted area 18b is determined by first storing fixed data in a predetermined location in the memory 18, then setting the stored area information (location and size) in the write restriction circuit 20 through write restriction data. Once the area information is set in the restriction circuit 20, the restriction circuit 20 prohibits data from being written (updated) in the write restricted area 18b. In other words, the write restricted area 18b is used as a ROM (read only memory) where the stored data can not be updated by a user.

The write restriction area 18b can be fixedly set in the write restriction circuit 20 during the manufacture, and the input terminal for supplying the write restriction data can be omitted, thereby preventing error operation after setting. In the same manner, when storing the fixed area information about the write restriction area 18b in the memory 18 during the manufacture, the input terminal is not necessary.

The other area in the memory 18 is not subject to write restriction, and become a read/write area 18a having a RAM function where data can be repeatedly read out and written by the user.

When applying the data storing apparatus of the present invention to a telephone set having an answering function, fixed information, such as an operation guide for the telephone set or fixed response message, is stored in the write restricted area 18b, while user answering messages or incoming messages are stored in the read/write area 18a. Thus, a single memory 18 serves as both ROM and RAM.

Readout of the analog data which have been written in the memory is carried out as follows. The readout circuit 22 includes a read address counter 22a for determining a read address where data readout was requested. The readout circuit 22 supplies the read address value determined by the read address counter 22a via the address bus to the address decoder 16 which specified the address of the memory cell. The stored data is read out through the data bus from a particular memory cell having an address designated by the address decoder 16.

During the readout, the write restriction circuit 20 does not carry out any readout restriction, and therefore the stored analog data can be freely read out from either the read/write area 18a or the write restriction area 18b.

The thus readout discrete analog data is supplied to the A/D converter 24, and is converted into compressed digital data represented by the predetermined bits number, tracing back the processing of the D/A converter 12. Before outputting the digital data as voice sound, the digital data is applied to the ADPCM decoder 26.

The ADPCM decoder 26 carries out a decoding process corresponding to the encoding process of the ADPCM encoder 11. The compressed digital data is decompressed by the ADPCM decoder 26. The recovered digital data is then converted by the D/A converter 28 into analog data, which is then output as voice sound from a speaker (not shown). Of course, in the case that the ADPCM encoder 11 is not used, the ADPCM decoder 26 is also not necessary.

As has been described, the data storing apparatus in accordance with the invention includes a D/A converter 12 for generating analog data to be stored in the memory 18 and an A/D converter 24 for converting the analog data read out from the memory 18 into digital data. An ADPCM encoder and ADPCM decoder are used for compressing and decompressing digital data for the purpose of increasing the data amount to be processed.

In this structure, digital processing is available inside the apparatus other than write and readout to and from the memory, and it can utilize maximum advantages of digital processing in process speed or data processing itself. The memory can also operate at an equal level to the digital data memory.

The memory in accordance with the invention is superior in capacity compared to the conventional digital memory, because it can store discrete analog data, each of which represents a plural number of bits of digital data, in a single memory cell. This technique considerably increases the data amount to be stored, while maintaining a small size and simple memory structure.

Since input and output to and from the data storing apparatus are in digital form, test devices for the apparatus can be operated by only using digital data during the manufacturing process, without the necessity of treating analog numbers.

The memory can serve as both ROM and RAM, contrary to the conventional data storing apparatus in which ROM and RAM are generally separately provided. This can be achieved by providing the write restriction circuit for controllably restricting writing to the memory. ROM and RAM can be realized on a single chip, resulting in a greatly reduced cost of the apparatus.

The write restricted area is determined by write restriction data after or before all the fixed data are written in the memory. The size and/or location of the write restricted area can be set during the manufacturing in accordance with the type of data storing apparatus, which provides a high degree of freedom in design, allowing ease of change of design.

Using the non-volatile memory EEPROM can prevent the stored data from being lost as a result of a power cut. Such data loss often happen with RAM. By using the EEPROM, an extra back-up power source or memory is no longer required. This memory can improve the reliability of the data storing apparatus, and is useful for a voice sound storing apparatus used in a telephone set.

What is claimed is:

1. A data storing apparatus having a memory capable of writing and reading out analog data, comprising:

a D/A converter for converting digital data represented by a predetermined number of bits into discrete analog data;

a memory divided into a read/write area and a write restricted area, wherein the analog data is stored in at least one of the read/write area and the write restricted area;

an A/D converter for converting said analog data read out from the memory back to digital data represented by said predetermined number of bits; and a write restriction circuit restricting the writing of said analog data into the write restricted area in the memory and controlling at least one of size and location of the write restricted area.

2. The data storing apparatus according to claim 1, wherein said memory is a non-volatile memory, which is capable of storing analog data by controlling the amount of electrical charge applied to each of a plurality of floating gates, thereby functioning as both read only memory and read/write memory.

3. The data storing apparatus according to claim 1, wherein said D/A converter creates analog data by dividing an entire voltage by a number based on the predetermined number of bits to produce discrete voltage values and by assigning each of the voltage values to each digital data represented by said predetermined number of bits.

4. The data storing apparatus according to claim 2, wherein said D/A converter creates analog data by dividing an entire voltage by a number based on the predetermined number of bits to produce discrete voltage values and by assigning each of the voltage values to each digital data represented by said predetermined number of bits.

5. A data storing apparatus having a memory capable of write and readout of analog data, comprising:

a first A/D converter for converting analog data into digital data;

a data compressor for compressing the digital data from the first A/D converter to generate compressed digital data represented by a predetermined number of bits;

a first D/A converter for converting the compressed digital data into discrete analog data;

a memory divided into a read/write area and a write restricted area, wherein the analog data is stored in at least one of the read/write area and the write restricted area;

a second A/D converter for converting the analog data read out from the memory back to the compressed digital data represented by the predetermined number of bits;

a decompressor for decompressing the compressed digital data; and a second D/A converter for converting the decompressed digital data into analog data; and a write restriction circuit restricting the writing of said analog data into the write restricted area in the memory and controlling at least one of size and location of the write restricted area.

6. The data storing apparatus according to claim 5, wherein said memory is a non-volatile memory which is capable of storing analog data by controlling the amount of electrical charge applied to each of a plurality of floating gates, thereby functioning as both a read only memory and read/write memory.

7. The data storing apparatus according to claim 5, wherein said first D/A converter generates analog data by dividing a whole voltage by a number based on the predetermined number of bits to produce discrete voltage values and by assigning each of the voltage values to each digital data represented by said predetermined number of bits.

* * * * *